US012588543B2

(12) United States Patent
Chen et al.

(10) Patent No.: US 12,588,543 B2
(45) Date of Patent: Mar. 24, 2026

(54) EMBEDDED FLIP CHIP PACKAGE SUBSTRATE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Wenjian Lin, Guangdong (CN); Gao Huang, Guangdong (CN); Benxia Huang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 402 days.

(21) Appl. No.: 18/221,518

(22) Filed: Jul. 13, 2023

(65) Prior Publication Data

US 2024/0071852 A1 Feb. 29, 2024

(30) Foreign Application Priority Data

Aug. 29, 2022 (CN) .......................... 202211042694.6

(51) Int. Cl.
H01L 23/495 (2006.01)
H01L 21/48 (2006.01)
(Continued)

(52) U.S. Cl.
CPC ...... H01L 23/3121 (2013.01); H01L 21/4857 (2013.01); H01L 21/563 (2013.01);
(Continued)

(58) Field of Classification Search
CPC ............. H01L 23/3121; H01L 21/4857; H01L 21/563; H01L 23/49811; H01L 23/49822;

H01L 24/16; H01L 2224/16225; H01L 21/4846; H01L 21/568; H01L 2221/68345; H01L 2221/68359; H01L 23/562; H01L 21/486; H01L 21/6835; H01L 23/49827; H01L 23/49838; H01L 23/49894; H01L 2924/181; H01L 21/50; H01L 21/56; H01L 23/3107; H01L 23/12; H01L 23/28; H05K 3/341; H05K 1/185; H05K 3/0026; H05K 3/007; H05K 3/3494

(Continued)

(56) References Cited

U.S. PATENT DOCUMENTS 11,482,497 B2 * 10/2022 Lin ..................... H01L 23/3171
2021/0082850 A1 * 3/2021 Chang ................. H01L 23/3185

* cited by examiner

*Primary Examiner* — Theresa T Doan
(74) *Attorney, Agent, or Firm* — The PL Law Group, PLLC

(57) ABSTRACT

A manufacturing method for an embedded flip chip package substrate includes laminating a first dielectric layer on the first line layer formed on a carrier plate, forming a first window on the first dielectric layer, filling a first copper post in the first window, forming a second window on the first dielectric layer, mounting a flip chip to the second window, sequentially stacking a packaging layer and a second dielectric layer covered with a first metal layer on the first dielectric layer, pressing a packaging layer encapsulating the first copper post and the flip chip and a second dielectric layer, curing the packaging layer, opening a hole through the first metal layer, the second dielectric layer and the packaging layer to form an interlayer conducting blind hole, forming a second line layer on the first metal layer, and removing the carrier plate to obtain a package substrate.

8 Claims, 14 Drawing Sheets

(51) Int. Cl.
    *H01L 21/56*         (2006.01)
    *H01L 23/00*         (2006.01)
    *H01L 23/31*         (2006.01)
    *H01L 23/498*       (2006.01)

(52) U.S. Cl.
    CPC .. *H01L 23/49811* (2013.01); *H01L 23/49822*
               (2013.01); *H01L 24/16* (2013.01); *H01L*
                        *2224/16225* (2013.01)

(58) Field of Classification Search
    USPC ........................................................ 257/668
    See application file for complete search history.

EMBEDDED FLIP CHIP PACKAGE SUBSTRATE AND MANUFACTURING METHOD THEREOF

CROSS-REFERENCE TO RELATED APPLICATION AND CLAIM OF PRIORITY

This application claims the benefit under 35 USC § 119 of Chinese Patent Application No. 2022110426946, filed on Aug. 29, 2022, in the China Intellectual Property Office, the entire disclosure of which is incorporated herein by reference for all purposes.

BACKGROUND

1. Technical Field

The present application relates to the technical field of semiconductor packaging, and in particular to an embedded flip chip package substrate and a manufacturing method.

2. Background Art

With the continuous development of the electronic industry, multi-function and miniaturization of electronic products have become a trend. In the field of package substrates, embedding components and parts into a substrate can facilitate electronic products to achieve requirements of high integration, multi-function, and miniaturization.

In the related art, a flip chip is usually mounted to the surface of a Substrate, namely, a solder resist surface, and the chip is wrapped in the form of Molding rather than being embedded in the interior of the Substrate; furthermore, the existing embedding technology is usually to first make a Cavity on the substrate, then to mount a device to be embedded into the Cavity, and then to press fit the dielectric material to fill the Cavity so as to cover the embedded device. Finally, the following steps: through laser drilling, PID dielectric pattern transfer, sandblasting, and other ways to form a small hole for conducting chip terminals, and then plating the small hole to achieve the electrical interconnection between the chip and the substrate.

In addition, in the process of encapsulating the chip, perhaps due to the implementation of single-sided capsulation, the upper and lower parts of the chip are not symmetrical. This can easily cause the bending of the entire substrate during the curing process after packaging.

SUMMARY

In view of this, the object of the present application is to provide an embedded flip chip package substrate and a manufacturing method thereof. The embedded flip chip package substrate does not need to manufacture a cavity, and the flip chip and the first line layer need to be electrically connected by means of laser drilling and the like and then be conducted by electroplating, thereby shortening the process flow and reducing the manufacturing cost.

Based on the above purpose, the present application provides an embedded flip chip package substrate and a manufacturing method thereof.

In the first aspect, the present application provides an embedded flip chip package substrate and a manufacturing method thereof, including the following steps:

(a) providing a carrier plate; and preparing a first line layer on an upper surface of the carrier plate, and laminating a first dielectric layer on the first line layer;

(b) forming a first window on the first dielectric layer, and filling a first copper post in the first window so that the first copper post is electrically connected to the first line layer;

(c) forming a second window on the first dielectric layer, and installing a flip chip on the second window such that the first line layer and a terminal of the flip chip are electrically connected through the second window;

(d) sequentially stacking a packaging layer and a second dielectric layer on the first dielectric layer, wherein the second dielectric layer is covered with a first metal layer on the upper surface remote from the packaging layer;

(e) pressing the packaging layer and the second dielectric layer such that the packaging layer encapsulates the first copper post and the flip chip, and curing the packaging layer;

(f) opening a hole through the first metal layer, the second dielectric layer, and the packaging layer to form an interlayer conducting blind hole, wherein the interlayer conducting blind hole exposes the upper surface of the first copper post;

(g) forming a second line layer on the upper surface of the first metal layer, wherein the second line layer is electrically connected to the first line layer through the first copper post; and (h) removing the carrier plate to obtain the package substrate.

In the second aspect, the present application further provides an embedded flip chip package substrate, including:

a first line layer; a first dielectric layer on the first line layer; a flip chip mounted to the first dielectric layer, wherein a terminal of the flip chip is electrically connected to the first line layer by passing through the first dielectric layer; a packaging layer on the first dielectric layer, wherein the packaging layer encapsulates the flip chip; a second dielectric layer on the packaging layer; and a second line layer on the second dielectric layer, wherein the first line layer and the second line layer are electrically connected by a first copper post; wherein the first dielectric layer and the second dielectric layer have a same material.

Optionally, the second dielectric layer has substantially the same thickness as the first dielectric layer.

It can be seen from the above that the embedded flip chip package substrate and a manufacturing method thereof provided by the present application have at least the following beneficial effects: by using the manufacturing method flow of the present application, since it is not necessary to pre-manufacture a cavity as in the existing embedding technology and to pre-attach an adhesive substance to bond a chip, the process steps are reduced and the manufacturing difficulty is reduced; at the same time, by using reflow soldering to solder the chip to the first line layer, the electrical interconnection between the chip and the first line layer can be conveniently realized, without, by means of laser drilling and like means, making conductive holes and filling holes by electroplating to realize the electrical connection between the chip and the first line layer.

Furthermore, since a second dielectric layer which is substantially the same as the first dielectric layer is added to the packaging layer, when the packaging layer is heated and cured, due to the same degree of thermal expansion between the first dielectric layer and second dielectric layer which serves as a constraint, the stresses on the upper surface and the lower surface of the packaging layer are basically the same. Therefore, the problem of warping of the substrate caused by the difference in stresses on the upper surface and lower surface of the packaging layer during curing in the prior art does not occur.

BRIEF DESCRIPTION OF THE DRAWINGS

In order to illustrate the technical solutions of the present application or in the related art more clearly, the following will briefly introduce the drawings that need to be used in the description of the embodiments or in the related art. Obviously, the drawings in the following description are merely embodiments of the present application. For those of ordinary skills in the art, other drawings can be obtained according to these drawings without involving inventive efforts.

DETAILED DESCRIPTION OF THE EMBODIMENTS

Figure 1:
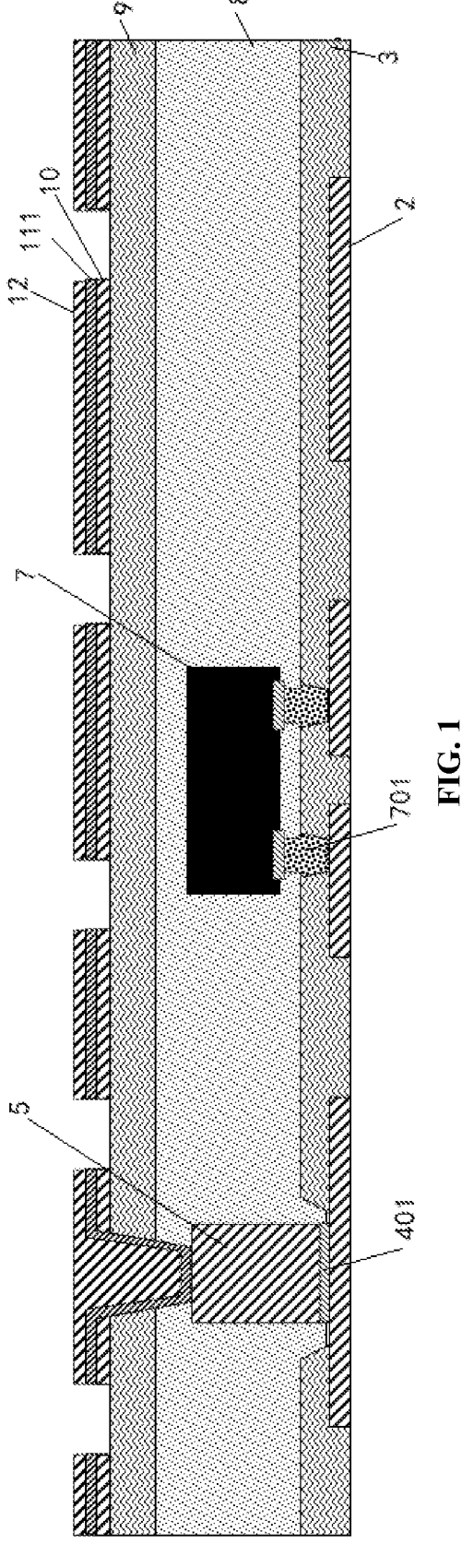
FIG. 1 is a schematic cross-sectional diagram of an overall structure before removing a carrier plate in one embodiment of the present application.

In order to make the purpose, technical solution, and advantages of the present application clearer, the present application will be further described in detail below in conjunction with specific embodiments and with reference to the accompanying drawings. It should be understood that the specific embodiments described herein are only used to explain the present application and are not intended to limit it. Therefore, they do not have technical substantive significance. Any structural modifications, changes in proportional relationships, or adjustments in size without affecting the efficacy and purpose that the present application can achieve should still fall within the scope of the technical content disclosed in the present application.

This section will provide a detailed description of the specific embodiments of the present application. The preferred embodiments of the present application are shown in the accompanying drawings. The purpose of the accompanying drawings is to supplement the textual description with graphics, enabling people to intuitively and vividly understand each technical feature and the overall technical solution of the present application. However, it cannot be understood as a limitation on the scope of protection of the present application.

It needs to be noted that unless otherwise defined, technical or scientific terms used in the embodiments of the present application shall have the general meaning as understood by one of ordinary skills in the art to which the present application belongs. The "first", "second", and similar words used in the embodiments of the present application do not denote any order, quantity, or importance, but are only used to distinguish different constituent parts. Similar words such as "including" or "containing" mean that the element or object appearing before the word covers the element or object listed appearing after the word and its equivalents, without excluding other elements or objects. Similar terms such as "connection" or "connected" are not limited to physical or mechanical connections, but can include electrical connections, whether direct or indirect. "Up", "down", "left", "right", etc. are only used to represent the relative position relationship. When the absolute position of the described object changes, the relative position relationship may also change accordingly.

Unlike the method for packaging a flip chip in the related art, the present application is to change the flip chip from surface mounting to being embedded into the interior of a substrate, and at the same time, there is no need to make a cavity on the substrate; then the device to be embedded is mounted in the cavity; in addition, after the chip is embedded, there is no need to, by means of laser drilling, etc., make a via hole or fill a hole by electroplating. Instead, the solder joint of the flip chip is mounted to the first line layer through the first dielectric layer, and then through reflow soldering, the electrical interconnection between the chip and the substrate is realized. Since a cavity needs to be made, the interconnection of the chip to the substrate needs to be conducted by electroplating again by laser drilling and other means to achieve electrical connection such that the process flow is long, and the cost is high.

Figure 2:
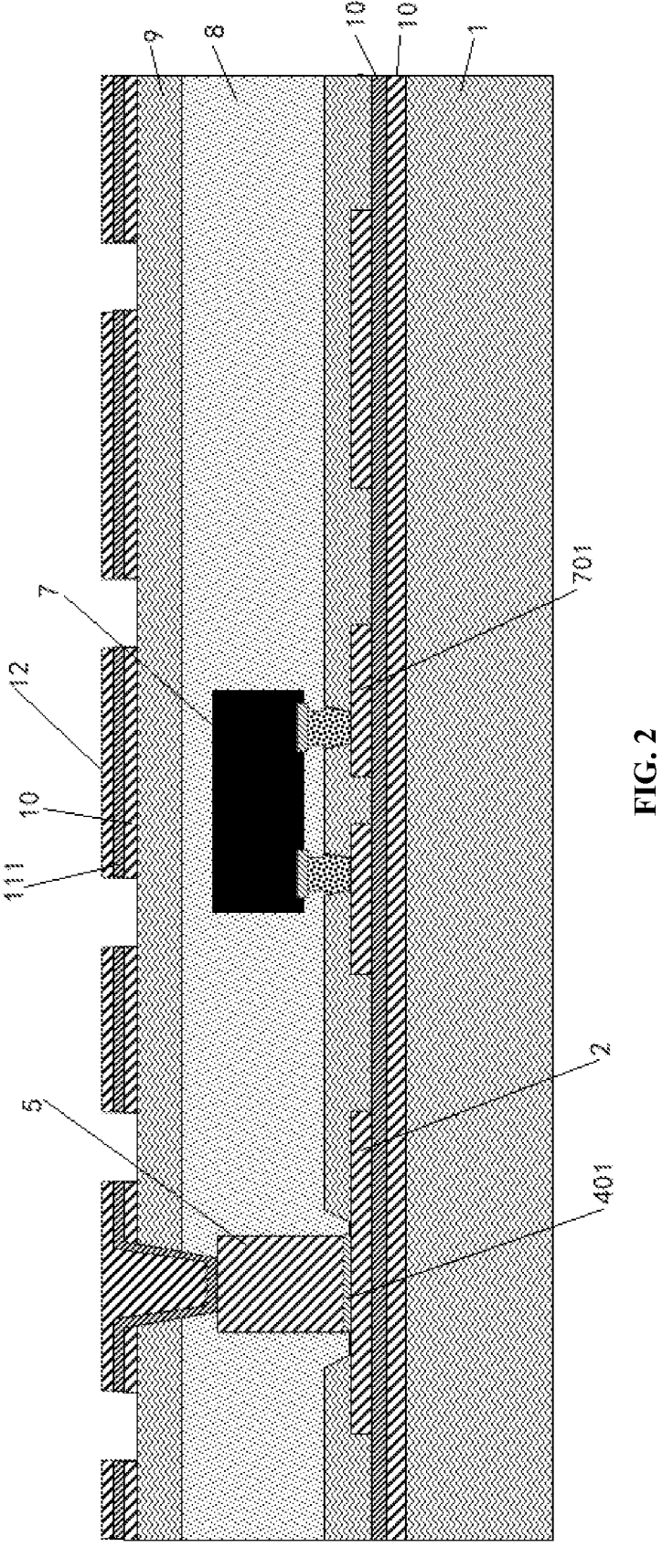
FIG. 2 is a schematic cross-sectional diagram of an overall structure of one embodiment of the present application.

In order to facilitate the understanding of an embedded flip chip package substrate provided by an embodiment of the present application, its specific structure will be described below with reference to the accompanying drawings. Reference is first made to FIGS. 1 and 2. FIG. 1 shows a schematic cross-sectional diagram of an overall structure of an embedded flip chip package substrate. FIG. 2 shows a schematic cross-sectional diagram of an overall structure with a carrier plate that has not been removed.

It can be seen from FIGS. 1 and 2 that the embedded flip chip package substrate includes a first dielectric layer 3 and a first line layer 2 below the first dielectric layer 3; and a packaging layer 8 on the first dielectric layer 3, wherein the material for manufacturing the packaging layer 8 is generally a glass-fiber-free material, such as an ABF material or a RCF material, etc.; further including a flip chip 7 embedded inside the packaging layer, wherein the flip chip 7 is provided with a welding terminal 701, the welding terminal 701 is a solder ball bump, and the solder ball bump can be a tin-lead bump or a copper bump; and further including a second dielectric layer 9 on the packaging layer 8, wherein the second dielectric layer 9 and the first dielectric layer 3 can be selected to have the same material and thickness, so that during the process of curing the packaging layer 8, since the first dielectric layer and second dielectric layer have the same degree of thermal expansion and play a restraint role, the upper surface and the lower surface of the packaging layer are substantially stressed. Therefore, there is no problem of the substrate warpage caused by the difference in stress on the upper surface and the lower surface of the packaging layer during the curing in the prior art.

In some embodiments, a second line layer 12 on the second dielectric layer 9 is further included. The first line layer 2 is electrically connected with the soldering terminal 701 of the flip chip 7 and the second line layer 12, respectively, thereby completing the electrical connection inside the entire package substrate.

In some embodiments, a first copper post 5 is also encapsulated in the packaging layer 8. It electrically connects the first line layer 2 and the second line layer 12.

Figures 3A, 3B:
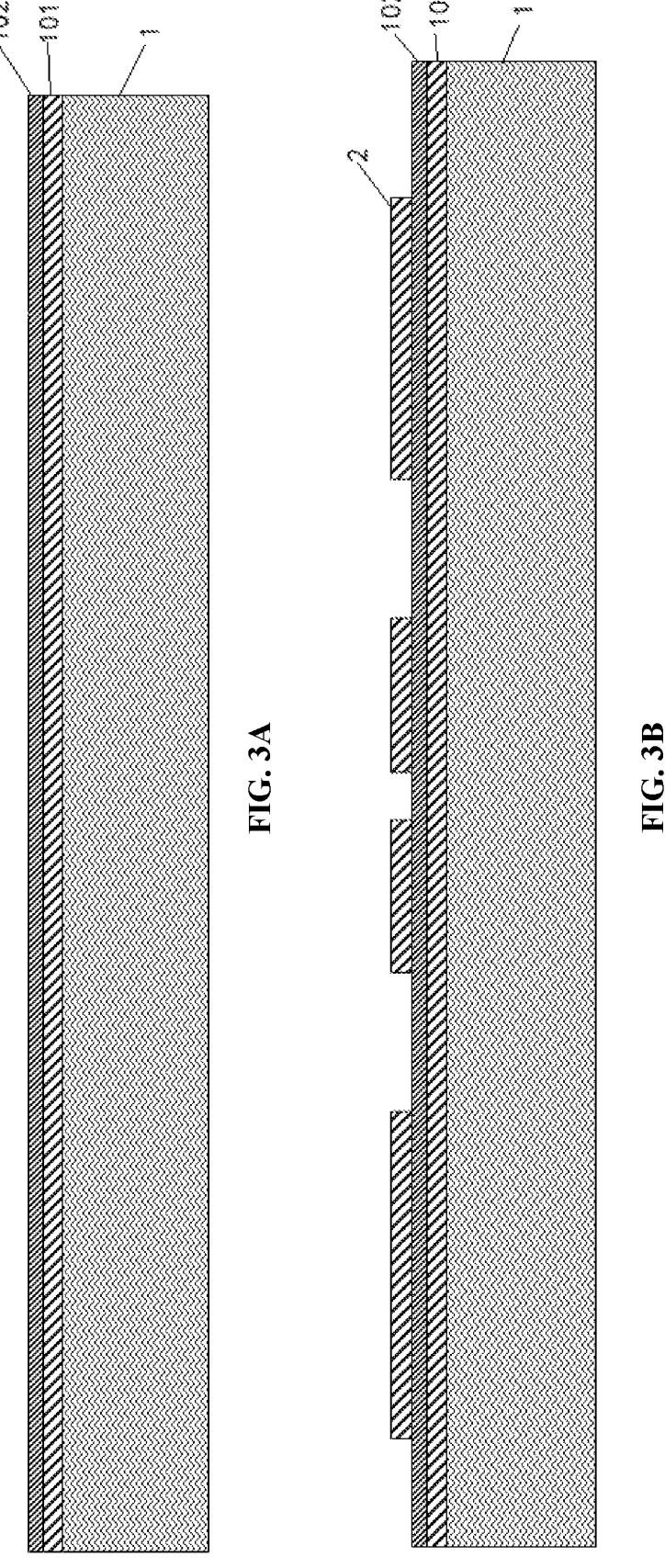
FIGS. 3A to 3R are schematic cross-sectional diagrams of intermediate states of a preparation process of one embodiment of the present application.
Figures 3C, 3D:
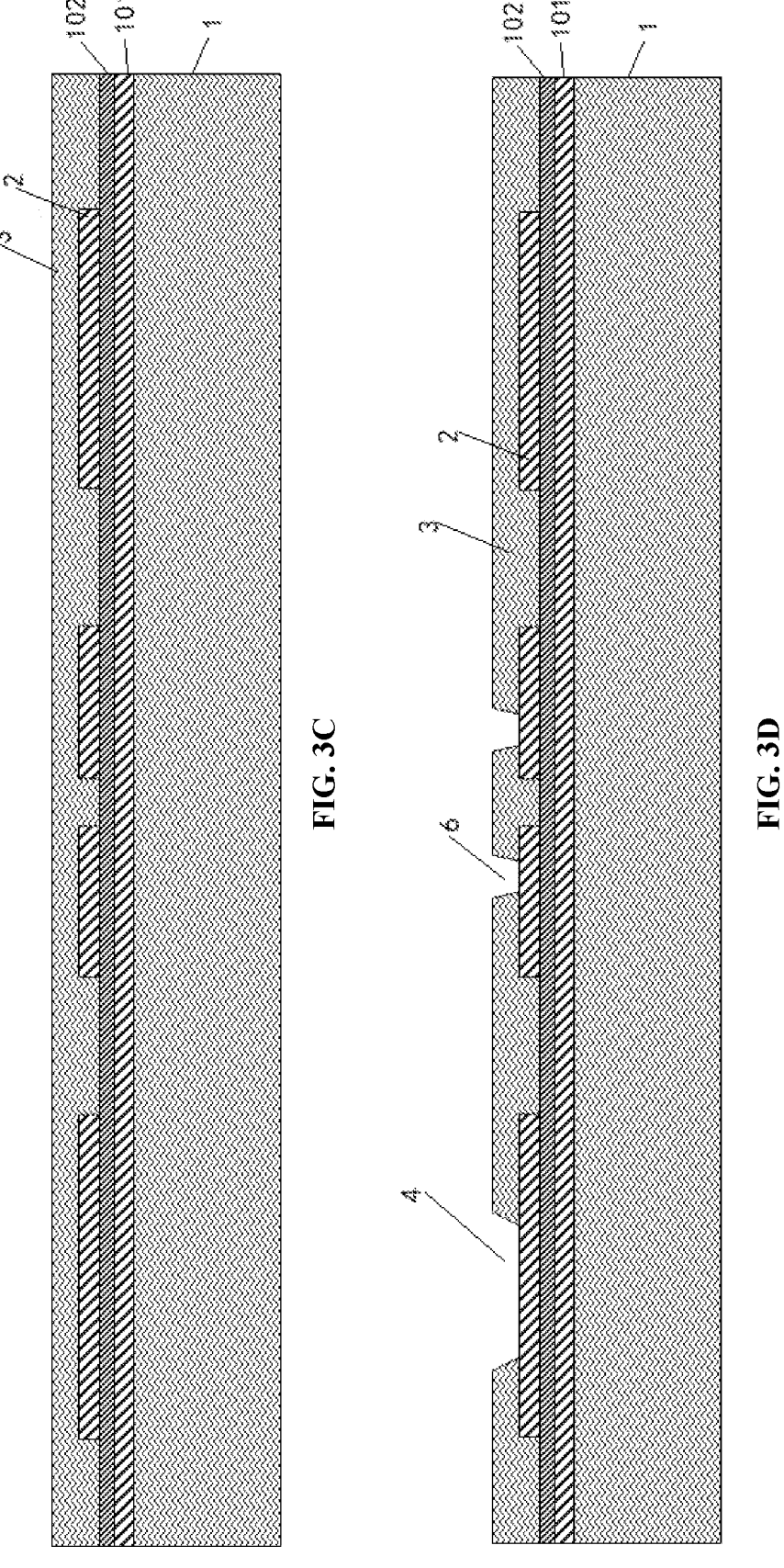
Figures 3E, 3F:
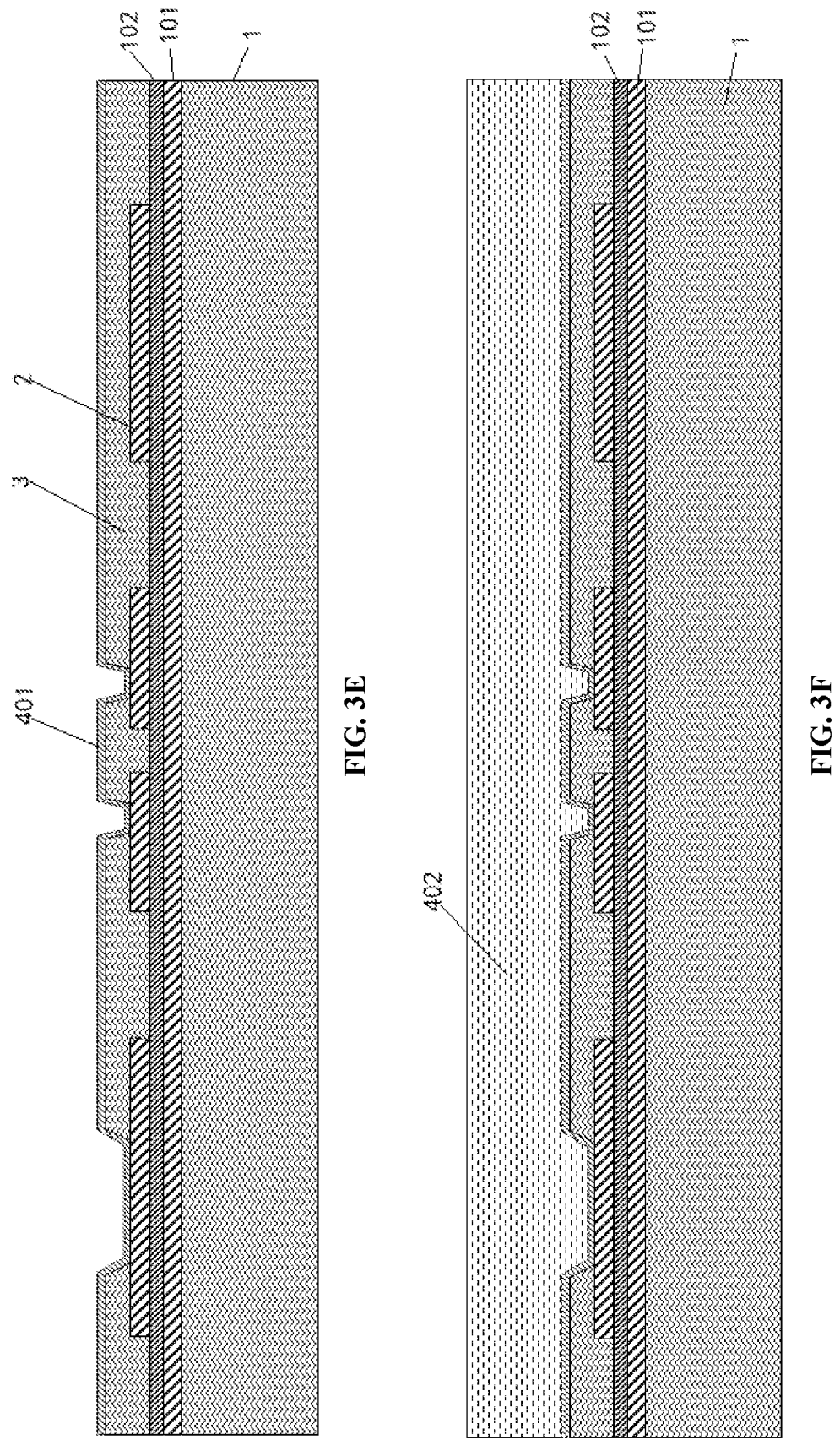
Figures 3G, 3H:
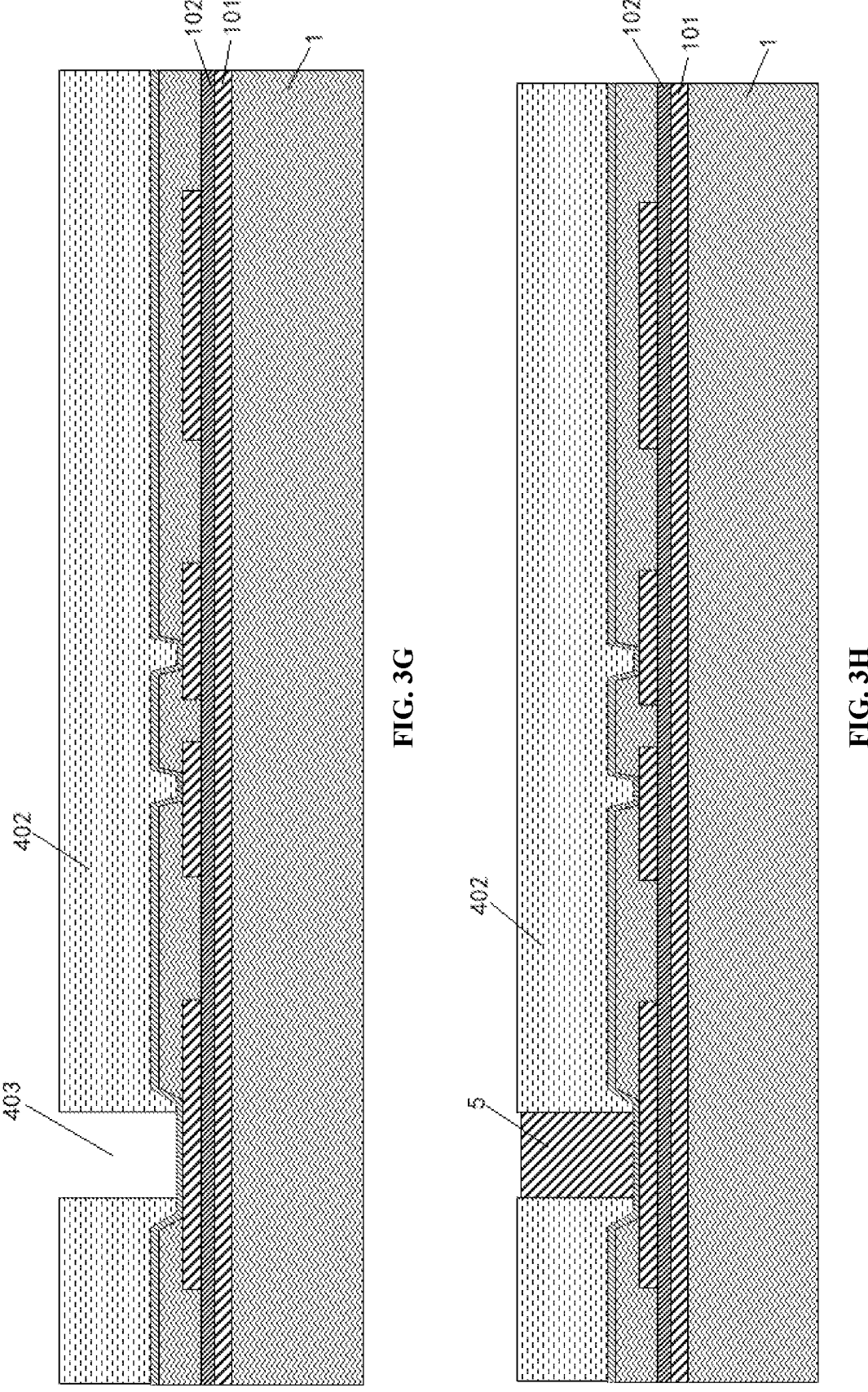
Figures 3I, 3J:
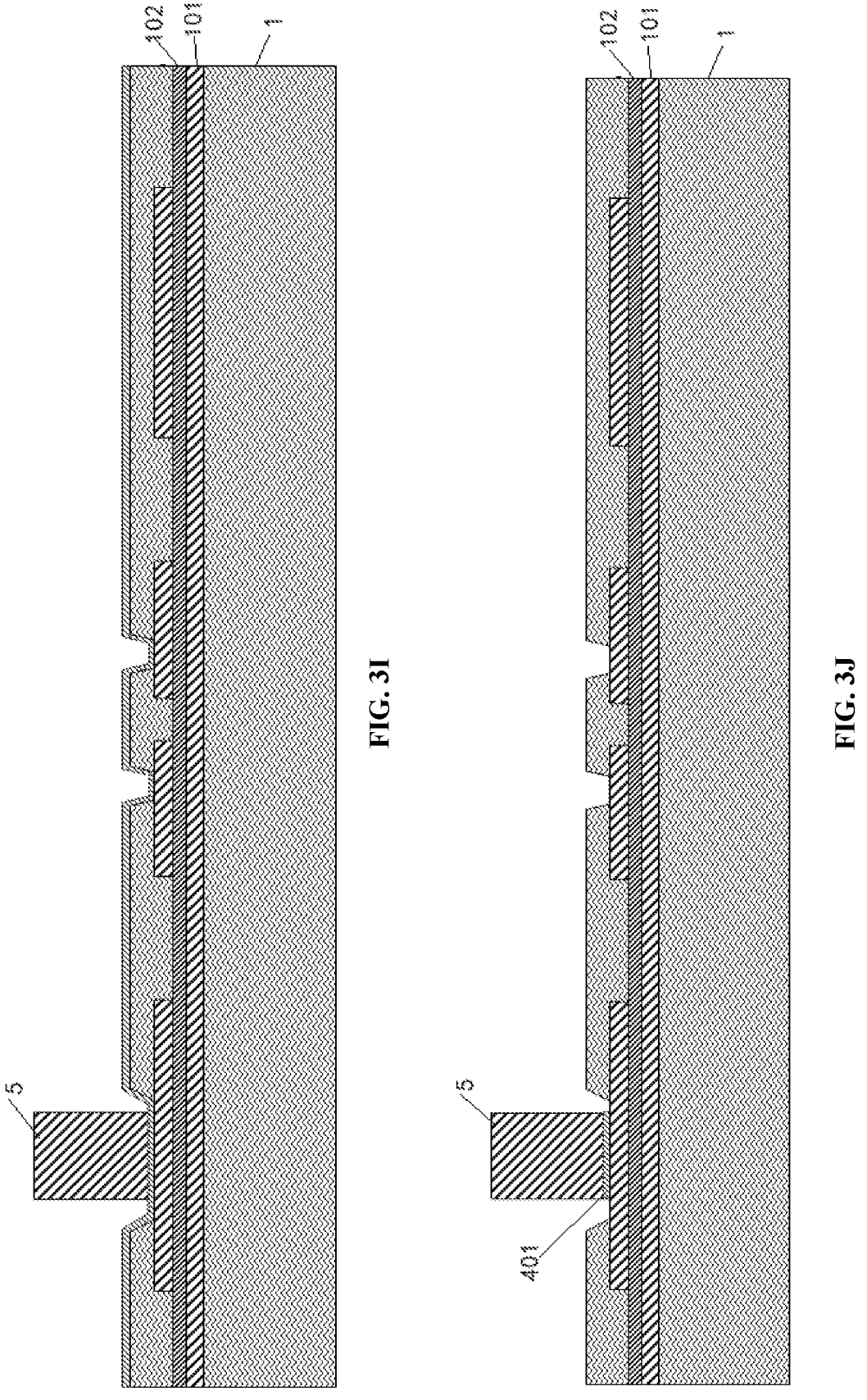
Figures 3K, 3L:
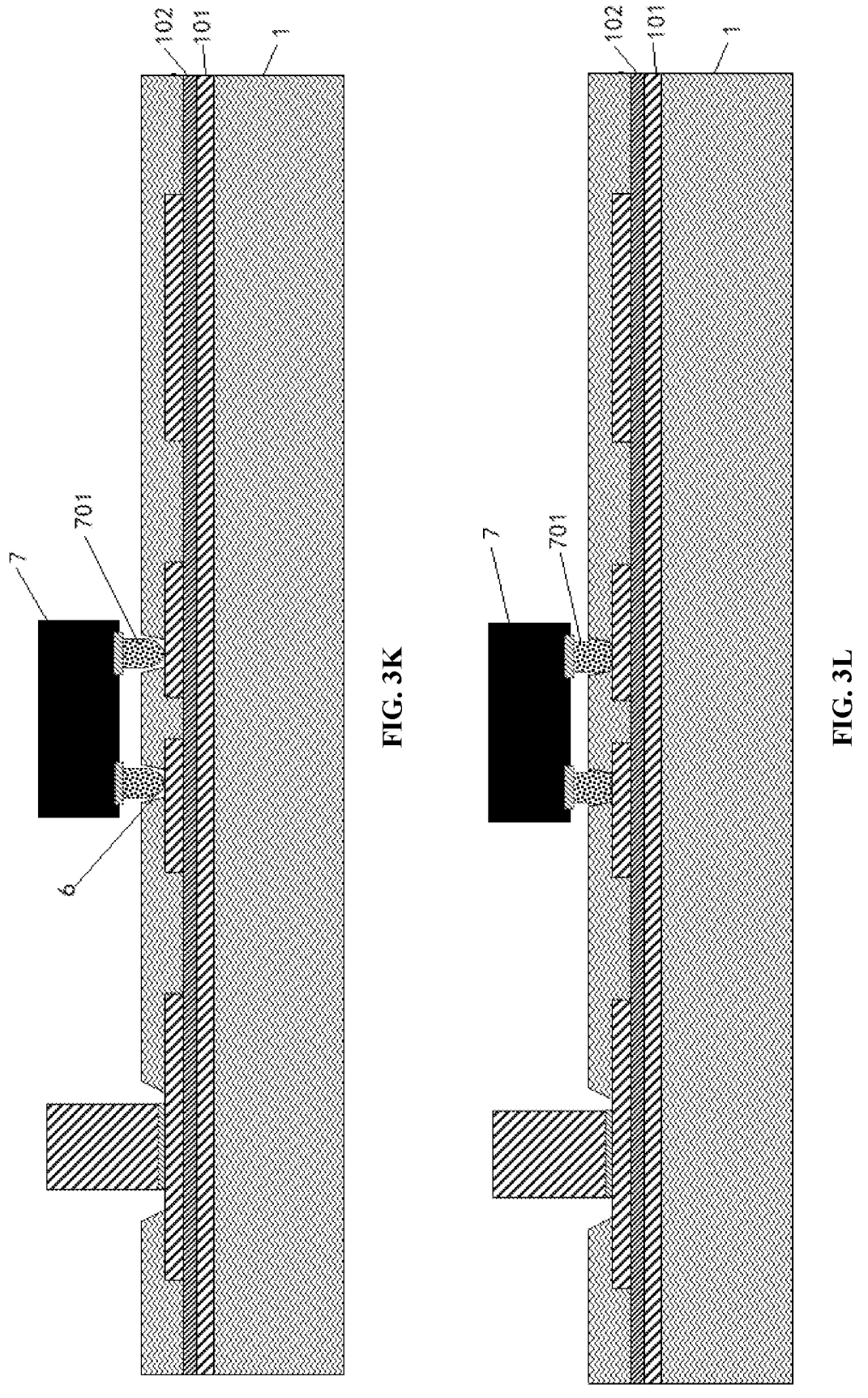
Figure 3M:
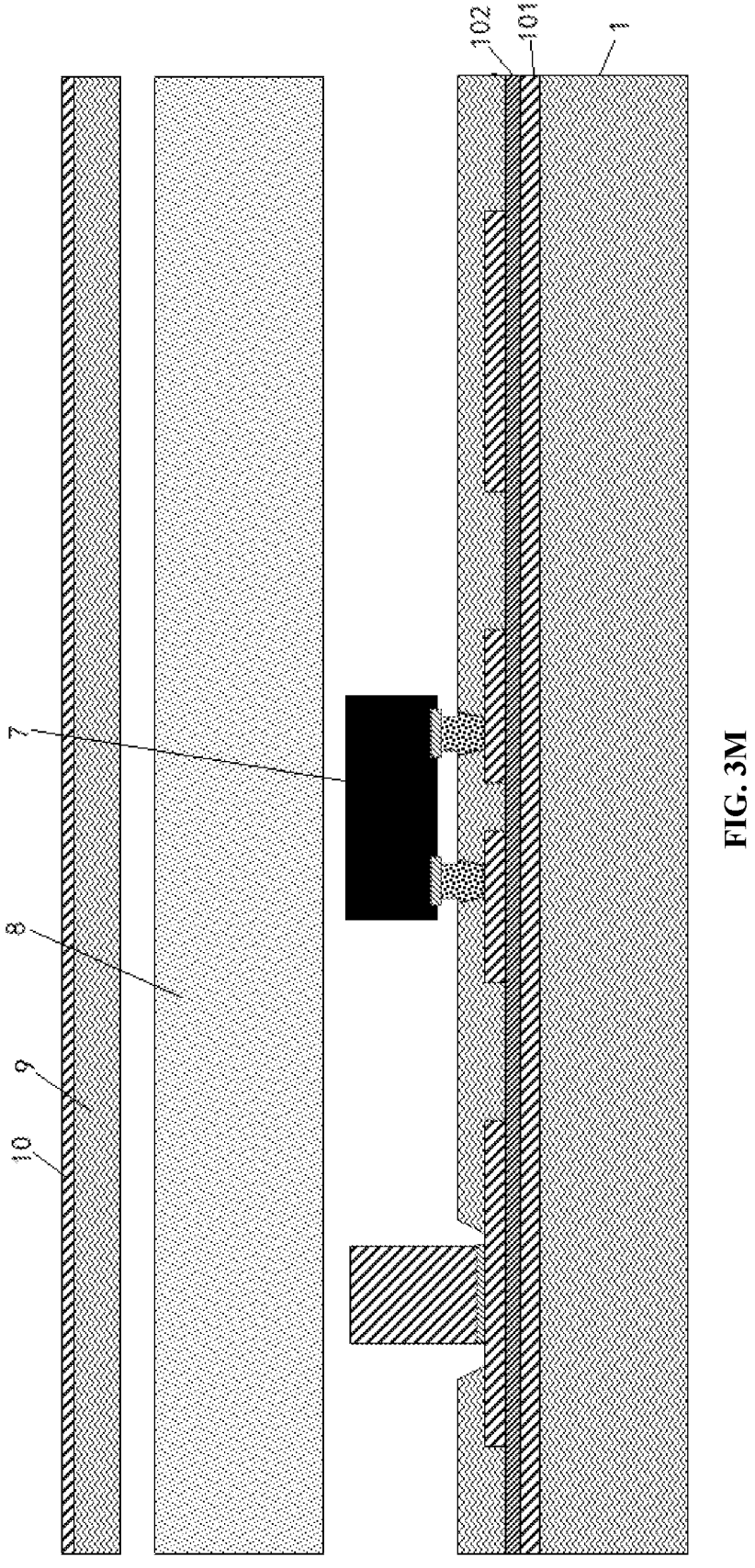
Figure 3N:
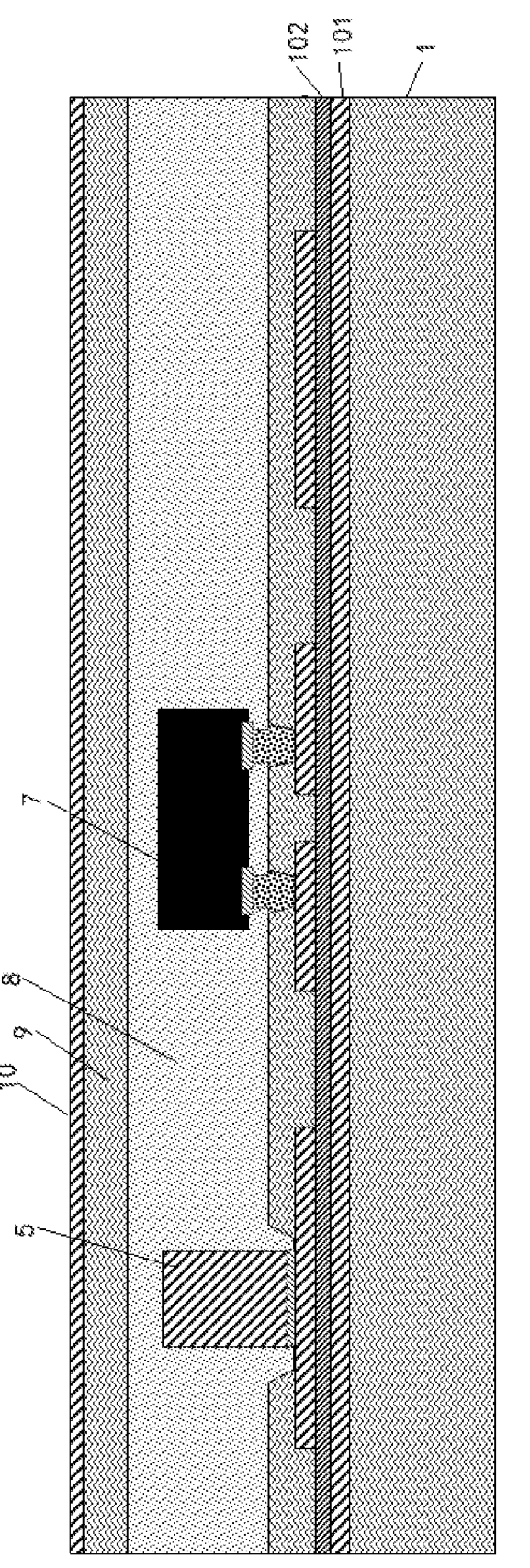
Figure 3O:
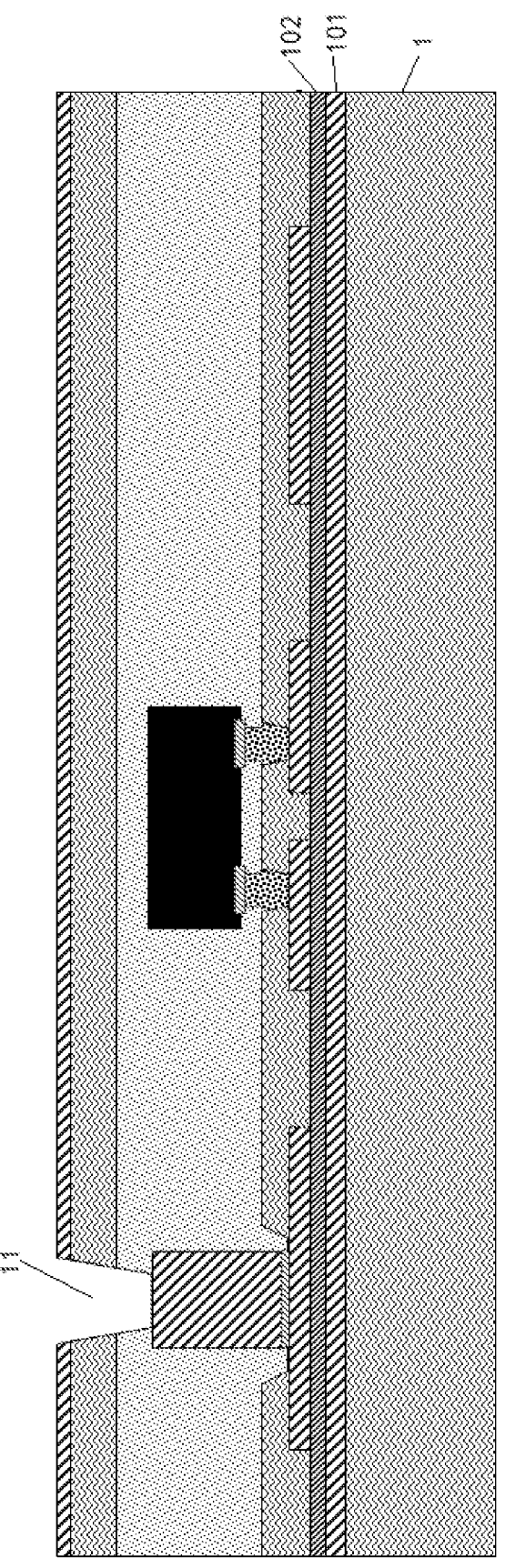
Figure 3P:
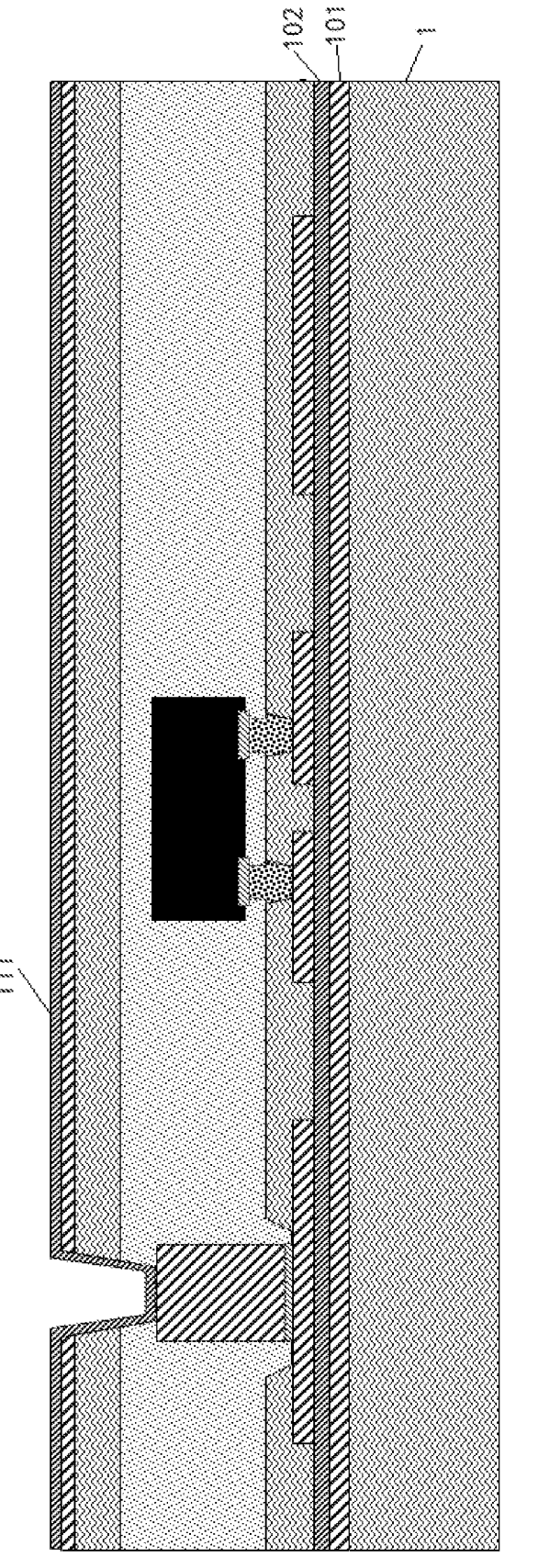
Figure 3Q:
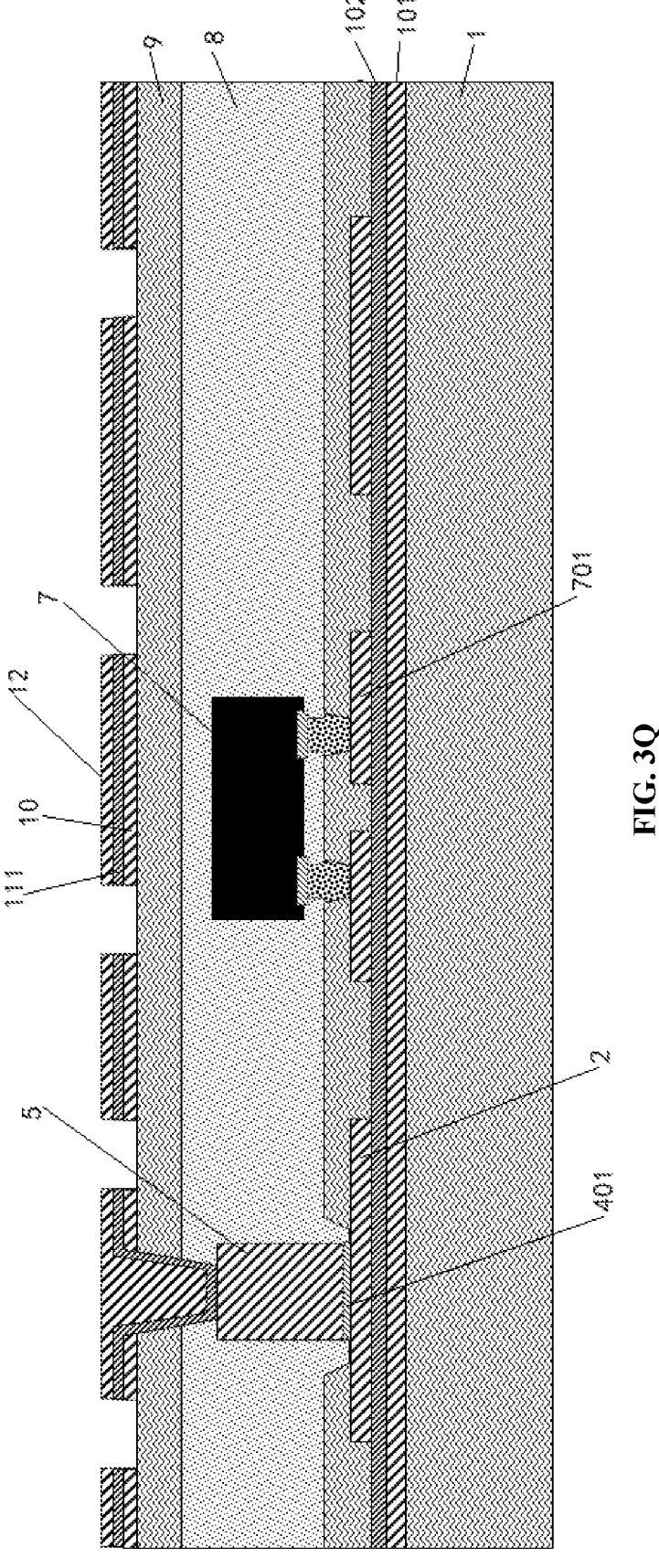
Figure 3R:
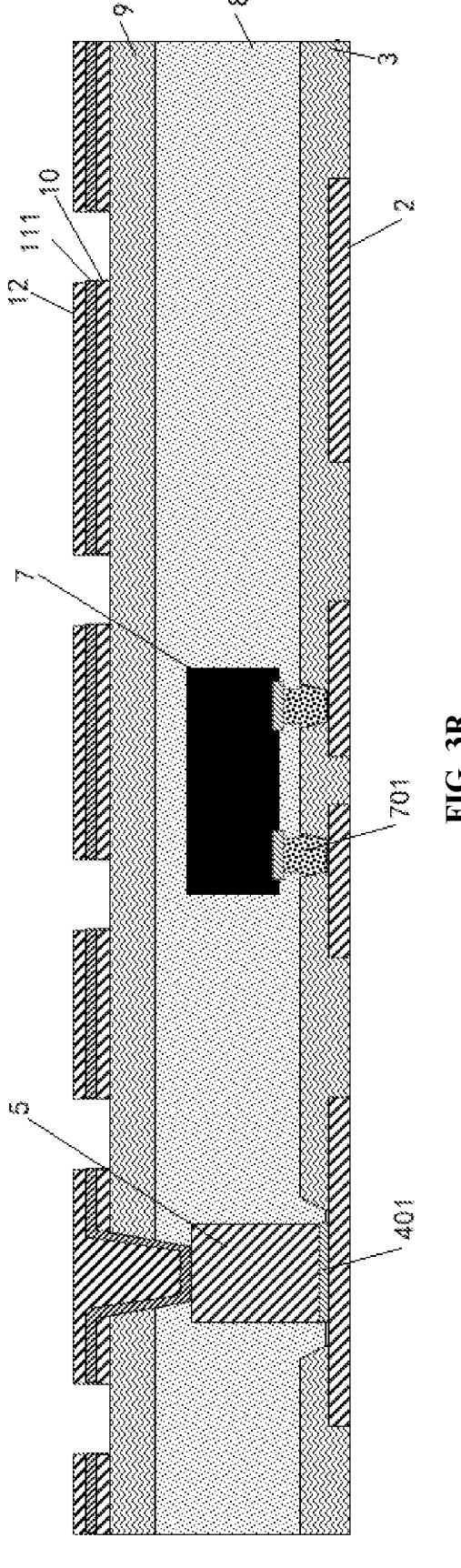

Referring to FIGS. 3A to 3R, schematic cross-sectional diagrams of intermediate structures of each step of a manufacturing method for embedding a flip chip 7 package substrate are shown.

A manufacturing method for an embedded flip chip 7 package substrate includes the following steps.

Firstly, a carrier plate 1 is provided. As shown in FIG. 3A, the material of the carrier plate 1 may generally be one of materials such as a mixture of glass, resin, and fiberglass material, metal, or silicon. The carrier plate 1 serves as temporary bonding, stacking, and bearing during the manufacturing process of the package substrate. Since a layer-by-layer manufacturing is required in a subsequent manufacturing process, the carrier plate 1 is selected to serve a subsequent bearing function. The surface of the carrier plate 1 is applied with a detachable metal layer, such as copper, aluminum, stainless steel, or aluminum alloy, etc. Preferably, in this embodiment, the upper surface of the carrier plate 1 is coated with a double-layer metal foil, such as a double-layer copper foil. The double-layer metal foil is physically pressed fit, and the two may also be separated by physical tearing. The double-layer metal foil is, for example, a second metal layer 101 and a third metal layer 102 as shown. The thickness of the second metal layer 101 may be 12-18 μm, and the thickness of the third metal layer may be 2 μm-5 μm. The thickness of the second metal layer 101 and the third metal layer 102 may vary according to practical situations, and are not limited herein.

Thereafter, a first line layer 2 is manufactured on the upper surface of the carrier plate 1 using an MSAP process, as shown in FIG. 3B. Generally, a first dielectric layer 3 is formed overlying the first line layer 2, and as shown in FIG. 3C, the first dielectric layer 3 may be selected to be reinforced organic material, such as a glass-fiber containing Pμmaterial.

Then, the first dielectric layer 3 is subjected to a laser drilling process to form a first window 4. As shown in FIG. 3D, the first window 4 exposes the first line layer 2, and provides for the first copper post 5 to be electrically connected to the first line layer 2 in a subsequent process.

Next, a first metal seed layer 401 is manufactured on the upper surface of the first dielectric layer 3 and the first window 4 by means of electroless copper plating or physical sputtering, as shown in FIG. 3E. Generally, in order to improve the contact accuracy of the first copper post 5 and the first line layer 2 during the process of deploying the achievement of the electrical connection between the first copper post 5 and the first line layer 2, it is usually necessary to form a first metal seed layer 401 between the two. By means of electroless copper plating or physical sputtering, the formation of the first metal seed layer 401 in the first window 4 can achieve close contact between the first copper post 5 and the first line layer 2 during the subsequent electroplating of the first copper post 5.

Thereafter, a plating-resistant dry film layer 402 is prepared on the upper surface of the first metal seed layer 401. As shown in FIG. 3F, the plating-resistant dry film layer 402 provides plating-resist protection for the overall structure while facilitating the subsequent plating to form the first copper post 5.

The plating-resistant dry film layer 402 above the first window 4 is exposed and developed to obtain a window pattern 403 of the first copper post 5, as shown in FIG. 3G.

The window pattern 403 is plated, and a first copper post 5 is formed in the window pattern 403. As shown in FIG. 3H, at this time, the first copper post 5 is electrically connected to the first line layer 2 through the first metal seed layer 401.

Next, the plating-resistant dry film layer 402 is removed, as shown in FIG. 3I, and the first metal seed layer 401 is exposed.

The first metal seed layer 401 exposed on the upper surface of the first dielectric layer 3 is etched as shown in FIG. 3J.

Then, the first dielectric layer 3 is processed by using laser drilling to form a second window 6. As shown in FIG. 3D, and here, in order to save the process flow, when the first window 4 is performed, the second window 6 can also be simultaneously formed by using laser drilling, and the second window 6 is used for the flip chip 7 to communicate with the first line layer 2.

Dipping a soldering terminal 701 of the flip chip 7 into a soldering flux thin film for soldering flux, and inserting the soldering terminal 701 of the flip chip 7 into the second window 6. As shown in FIG. 3K, the soldering terminal 701 is a solder ball bump, and the solder ball bump is a metal bump, for example, a tin-lead bump or a copper bump can both be used, and the function of dipping the soldering flux can play a fixing role in flipping the chip 7 when the soldering terminal 701 is inserted into the second window 6, and the position of the chip 7 does not change after the second window 6 is inserted into; at the same time, the soldering flux can wet the surface of the soldering point 701 and enhance the solderability when the soldering terminal 701 is soldered in the subsequent process flow.

Then, the first line layer 2 is connected to a power source, and the first line layer 2 is heated to perform reflow soldering on the soldering terminal 701 in the second window 6 so as to realize the electrical connection between the flip chip 7 and the first line layer 2; as shown in FIG. 3L, in the process of reflow soldering, by soldering the soldering terminal 701, the soldering point 701 is tightly soldered in the second window 6, the chip 7 is electrically connected to the first line layer 2, and at the same time, the chip 7 also achieves a fixing effect via the soldering terminal 701.

Next, the packaging layer 8 is stacked over the first copper post 5 and the chip 7, while a second dielectric layer 9 is stacked on the upper surface of the packaging layer 8. The first metal layer 10 is formed on the upper surface of the second dielectric layer 9, as shown in FIG. 3M. The packaging layer 8 is configured to press fit the first copper post 5 and the chip 7 in a subsequent process flow, so that the packaging layer 8 encapsulates the first copper post 5 and the flip chip 7, and the packaging layer 8 can be a glass-fiber-free dielectric material, such as Ajinomoto ABF material or RCF material, etc. and is not limited herein.

Then, the first metal layer 10, the second dielectric layer 9, and the packaging layer 8 are simultaneously pressed fit on a vacuum laminator, and the packaging layer 8 is subjected to a curing treatment, as shown in FIG. 3N. After the press fit is completed, the entire packaging layer 8 completely coats the first copper post 5 and the flip chip 7, and then may be baked and cured in an oven or may be pressed fit and cured on a laminating machine. When the packaging layer 8 is pressed fit, the packaging layer 8 can fill the gap between the flip chip 7 and the first dielectric layer 3 by means of its own liquidity and capillary action. In order to fully package and protect the flip chip 7, the thickness of the packaging layer 8 should be greater than or equal to the thickness of the flip chip 7, so that the packaging layer 8 can completely coat the flip chip 7.

During the heating and curing of the packaging layer 8, the packaging layer 8 tends to be warped during the curing process due to the stress imbalance between the upper surface and lower surface of the packaging layer 8 which is caused by different materials above and below the packaging layer 8. However, in the present embodiment, the upper part and lower part of packaging layer 8 are the second dielectric layer 9 and the first dielectric layer 3, respectively; since the materials of the second dielectric layer 9 and the first dielectric layer 3 are the same, the surfaces are both provided with a metal line layer, the thicknesses of the two can also be substantially the same, and the thermal expansion coefficients of the two are substantially the same, thereby serving as symmetric constraints. Therefore, during the heating and curing of the packaging layer 8, the upper surface and the lower surface structures thereof are symmetrical and the stress is the same so that the packaging layer 8 is effectively prevented from warping.

Then, laser drilling is performed on the first metal layer 10, the second dielectric layer 9, and the packaging layer 8 to form an interlayer conducting blind hole 11. As shown in FIG. 3O, the interlayer conducting blind hole 11 exposes the upper surface of the first copper post 5, the second line layer 12 is prepared in the process flow after the position, and the electrical connection preparation between the first line layer 2 and the second line layer 12 is realized through the first copper post 5.

Thereafter, one layer of the second metal seed layer 111 is formed on the surface of the first metal layer 10 by means of electroless copper plating or physical sputtering. The second metal seed layer 111 covers the interlayer conducting blind hole 11, as shown in FIG. 3P.

Thereafter, the second line layer 12 is prepared on the upper surface of the second metal. The second line layer 12 is electrically connected to the first line layer 2 through the first copper post 5, and the second metal seed layer 111 and the first metal layer 10 are etched. As shown in FIG. 3Q, the lower surface of the first copper post 5 is electrically connected to the first line layer 2 through the first metal seed layer 401, the upper surface of the first copper post 5 is electrically connected to the second line layer 12 through the second metal seed layer 111, and the terminal of the chip 7 is electrically connected to the first line layer 2 by passing through the first dielectric layer 3.

The carrier plate 1 is removed to obtain a package substrate. As shown in FIG. 3R, the second metal layer 101 and the third metal layer 102 are separated by means of physical tearing, and after the separation, the second metal layer 101 and the carrier plate 1 are still attached, and the third metal layer 102 can be physically pressed fit again on the upper surface of the second metal layer 101, so that the second metal layer 101 and the carrier plate 1 can be recycled, thus saving costs. After the separation is completed, the first dielectric layer 3, and the third metal layer 102 below the first line layer 2 are etched, and during the etching process, it is necessary to be careful not to cause damage to the first line layer 2. As another implementation mode, an etch-stopping layer such as a nickel layer may be formed on the upper surface of the third metal layer 102 to protect the first line layer 2 when the third metal layer 102 is etched.

It needs to be noted that some embodiments of the present application have been described above. Other embodiments are within the scope of the appended claims. In some cases, the acts or steps recorded in the claims may be executed in an order other than those of the embodiments described above and may still achieve the desired result. Additionally, the processes depicted in the figures do not necessarily require a particular order or sequential order as shown to achieve the desired result. Multi-tasking processing and parallel processing are also possible or may be advantageous in some implementation modes.

Those of ordinary skill in the art should understand that the discussion of any embodiment above is merely exemplary and is not intended to imply that the scope of the application (including the claims) is limited to these examples; combinations of technical features in the above embodiments, or between different embodiments, may also be made under the concept of the present application; the steps may be implemented in any order, and there may be many other variations of the different aspects of the embodiments of the present application as described above, which are not provided in detail for concision.

In addition, to simplify the explanation and discussion, and to avoid making the embodiments of the present application difficult to understand, well-known power source/grounding connections with integrated circuit (IC) chips and other components may or may not be shown in the provided drawings. In addition, the device can be shown in the form of a block diagram to avoid making the embodiments of the present application difficult to understand, and this also takes into account the fact that the details of the implementation modes of these block diagram devices are highly dependent on the platform on which the embodiments of the present application are to be implemented (i.e., these details should be fully within the understanding range of those skilled in the art). In the case where specific details (such as circuits) are elaborated to describe exemplary embodiments of the present application, it is apparent to those skilled in the art that the embodiments of the present application can be implemented without these specific details or with changes in these specific details. Accordingly, the description is to be regarded as illustrative rather than restrictive.

Although the present application has been described in conjunction with specific embodiments thereof, based on the previous description, many substitutions, modifications, and variations of these embodiments will be apparent to ordinary technical personnel in the art. For example, other memory architectures (such as Dynamic RAM (DRAM)) can use the discussed embodiments.

The embodiments of the present application are intended to cover all such substitutions, modifications, and variations that fall within the broad scope of the appended claims. Therefore, any omission, modification, equivalent replacement, improvement, etc. made within the spirit and principles of the embodiments of the present application should be included in the scope of protection of the present application.

What is claimed is:

1. A manufacturing method for an embedded flip chip package substrate, the method comprising:

providing a carrier plate;

preparing a first line layer on an upper surface of the carrier plate;

laminating a first dielectric layer on the first line layer;

forming a first window on the first dielectric layer, and filling a first copper post in the first window so that the first copper post is electrically connected to the first line layer;

forming a second window on the first dielectric layer, and installing a flip chip on the second window such that the first line layer and a terminal of the flip chip are electrically connected through the second window;

sequentially stacking a packaging layer and a second dielectric layer on the first dielectric layer, wherein the second dielectric layer is covered with a first metal layer on the upper surface remote from the packaging layer;

pressing the packaging layer and the second dielectric layer such that the packaging layer encapsulates the first copper post and the flip chip, and curing the packaging layer;

opening a hole through the first metal layer, the second dielectric layer, and the packaging layer to form an interlayer conducting blind hole, wherein the interlayer conducting blind hole exposes the upper surface of the first copper post;

forming a second line layer on the upper surface of the first metal layer, wherein the second line layer is electrically connected to the first line layer through the first copper post; and removing the carrier plate to obtain the package substrate.

2. The method according to claim 1, wherein the preparing of the first line layer and the laminating of the first dielectric layer on the first line layer comprise:

preparing a second metal layer on the upper surface of the carrier plate, and preparing a third metal layer on the upper surface of the second metal layer, wherein the second metal layer and the third metal layer are physically pressed against each other and can be separated by physical tearing.

3. The method according to claim 1, wherein the forming of the first window comprises:

treating the first dielectric layer by using laser drilling to form a first window, wherein the first window exposes the first line layer;

preparing a first metal seed layer by means of electroless copper plating or physical sputtering on the upper surface of the first dielectric layer and the first window;

preparing a plating-resistant dry film layer on the upper surface of the first metal seed layer, exposing and developing the plating-resistant dry film layer above the first window, performing development to obtain a windowing pattern of the first copper post, and electroplating the windowing pattern to form the first copper post; and removing the plating-resistant dry film layer and etching the first metal seed layer covering the upper surface of the first dielectric layer, wherein the first copper post is electrically connected to the first line through the first metal seed layer.

4. The method according to claim 1, wherein the forming of the second window comprises:

treating the first dielectric layer by using laser drilling to form a second window, wherein the second window exposes the first line layer; and inserting the terminal of the flip chip into the second window, and connecting the first line layer by reflow soldering to electrically connect the flip chip with the first line layer.

5. The method according to claim 1, wherein the pressing of the packaging layer and the second dielectric layer comprises:

preparing the second dielectric layer on the upper surface of the packaging layer, wherein the second dielectric layer is configured to have a same thickness as the first dielectric layer;

preparing the first metal layer on the upper surface of the second dielectric layer; and pressing the packaging layer, the second dielectric layer, and the first metal layer by a vacuum laminator, and performing curing, wherein the first copper post and the flip chip are both embedded inside the packaging layer.

6. The method according to claim 1, wherein the forming of the second line layer comprises:

forming a second metal seed layer on a surface of the first metal layer by electroless copper plating or physical sputtering, wherein the second metal seed layer covers the interlayer conducting blind hole;

forming the second line layer on the second metal seed layer; and etching the second metal seed layer and the first metal layer;

wherein the second line layer is electrically connected to the first copper post through the second metal seed layer.

7. The method according to claim 2, wherein the removing of the carrier plate comprises physically tearing apart the second metal layer and the third metal layer to remove the carrier plate.

8. The method according to claim 5, wherein the pressing of the packaging layer, the second dielectric layer and the first metal layer comprises:

filling a gap between the flip chip and the first dielectric layer by a flowability of the packaging layer.

* * * * *